US011183485B2

(12) United States Patent
Oomori

(10) Patent No.: US 11,183,485 B2
(45) Date of Patent: Nov. 23, 2021

(54) SEMICONDUCTOR MODULE

(71) Applicant: SUMITOMO ELECTRIC INDUSTRIES, LTD., Osaka (JP)

(72) Inventor: Hirotaka Oomori, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 176 days.

(21) Appl. No.: 16/461,070

(22) PCT Filed: Aug. 9, 2017

(86) PCT No.: PCT/JP2017/028993
§ 371 (c)(1),
(2) Date: May 15, 2019

(87) PCT Pub. No.: WO2018/096735
PCT Pub. Date: May 31, 2018

(65) Prior Publication Data
US 2019/0287948 A1   Sep. 19, 2019

(30) Foreign Application Priority Data
Nov. 24, 2016 (JP) .............................. JP2016-227745

(51) Int. Cl.
*H01L 25/07*       (2006.01)
*H01L 23/051*     (2006.01)
(Continued)

(52) U.S. Cl.
CPC .......... *H01L 25/072* (2013.01); *H01L 23/051* (2013.01); *H01L 23/3735* (2013.01);
(Continued)

(58) Field of Classification Search
CPC . H01L 25/072; H01L 23/051; H01L 23/3735; H01L 23/62; H01L 25/07
See application file for complete search history.

(56) References Cited

U.S. PATENT DOCUMENTS

2005/0095507 A1     5/2005  Kim et al.
2007/0215903 A1*   9/2007  Sakamoto ......... H01L 23/49844
                                                                257/192
(Continued)

FOREIGN PATENT DOCUMENTS

JP      2005-135895     5/2005
JP      2014-187874    10/2014

*Primary Examiner* — Marcos D. Pizarro
*Assistant Examiner* — Quinton Abrasfield
(74) *Attorney, Agent, or Firm* — IPUSA, PLLC

(57) ABSTRACT

A semiconductor module 1 according to one embodiment includes a first circuit board, circuit units and a first plate member; the circuit units include a second plate member, a vertical type transistor and a second circuit board; n first circuit unit of N circuit units electrically connect a back surface side conductive region to the first input interconnection pattern of the first circuit board; (N−n) second circuit unit of the N circuit units electrically connect the third conductive pattern and the fourth conductive pattern of the second circuit board to the first control interconnection pattern and the second input interconnection pattern of the first circuit board; the first plate member electrically connects the fourth conductive pattern of the first circuit units to the second plate member of the second circuit units; and the gate electrode pad of the vertical type transistor contained in the first circuit unit is electrically connected to the first control interconnection pattern of the first circuit board.

9 Claims, 13 Drawing Sheets

(51) Int. Cl.
    *H01L 23/373*     (2006.01)
    *H01L 23/62*      (2006.01)
    *H01L 25/18*      (2006.01)
    *H02M 1/34*       (2007.01)
    *H02M 7/48*       (2007.01)
    *H02M 7/537*      (2006.01)

(52) U.S. Cl.
    CPC .............. *H01L 23/62* (2013.01); *H01L 25/07* (2013.01); *H01L 25/18* (2013.01); *H02M 1/34* (2013.01); *H02M 7/48* (2013.01); *H02M 1/348* (2021.05); *H02M 7/537* (2013.01)

(56) References Cited

U.S. PATENT DOCUMENTS

2011/0194313 A1*  8/2011  Yoshinaga ........ H02M 3/33569
                                                363/21.12
2013/0258736 A1  10/2013  Higuchi et al.
2016/0343641 A1* 11/2016  Hori ................... H01L 24/11

\* cited by examiner

SEMICONDUCTOR MODULE

TECHNICAL FIELD

The present disclosure relates to a semiconductor module.

The present application is based on and claims priority to Japanese Patent Application No. 2016-227745 filed on Nov. 24, 2016, the entire contents of which are herein incorporated by reference.

BACKGROUND ART

In semiconductor modules, as disclosed in Patent Document 1, a module is known in which a plurality of transistors and a plurality of diodes are mounted on a circuit board. In the semiconductor module described in Patent Document 1, the plurality of transistors and the plurality of diodes are electrically connected so as to serve as a power converter circuit such as an inverter circuit.

Patent Document 1: Japanese Laid-Open Patent Application Publication No. 2015-135895

Patent Document 2: Japanese Laid-Open Patent Application Publication No. 2014-187874

SUMMARY OF THE INVENTION

A semiconductor module according to one aspect of the present disclosure includes (A) a first insulating substrate, a first input interconnection pattern formed on a surface of the first insulating substrate, a second input interconnection pattern, a first circuit board including a first control interconnection pattern and a second control interconnection pattern; (B) N (N being an integer of two or more) circuit units mounted on the first circuit board; and (C) a first plate member disposed opposite to the first circuit board with respect to the N circuit units and including a back surface side conductive region, wherein the first circuit units includes: (a) a second plate member including a top surface side conductive region and a back surface side conductive region electrically connected to each other; (b) a vertical type transistor including a first main electrode pad, and a second main electrode pad and a gate electrode pad that are formed opposite to the first main electrode pad, wherein the first main electrode pad is opposite to and is electrically connected to the top surface side conductive region of the second plate member; (c) a second circuit board including a second insulating substrate, a first conductive pattern formed on a back surface of the second insulating substrate and electrically connected to the gate electrode pad, a second conductive pattern formed on the back surface of the second insulating substrate and electrically connected to the second main electrode pad, a third conductive pattern formed on a top surface of the second insulating substrate and electrically connected to the first conductive pattern, and a fourth conductive pattern formed on the top surface of the second insulating substrate and electrically connected to the second conductive pattern, wherein n (n being an integer of one or more and (N−1) or less) first circuit unit of the N circuit units is mounted on the first circuit board so that the back surface side conductive region of the second plate member is opposite to and is electrically connected to the first input interconnection pattern, wherein (N-n) second circuit unit of the N circuit units is mounted on the first circuit board so that the third conductive pattern of the second circuit board is opposite to and is electrically connected to the second control interconnection pattern and that the fourth conductive pattern of the second control interconnection pattern is opposite to and is electrically connected to the second input interconnection pattern, wherein the first plate member electrically connects the fourth conductive pattern of the second circuit board contained in the n first circuit unit to the second plate member contained in the (N-n) second circuit unit, and wherein the gate electrode pad of the vertical type transistor contained in the n first circuit unit is electrically connected to the first control interconnection pattern.

MODE OF CARRYING OUT THE INVENTION

Figure 1:
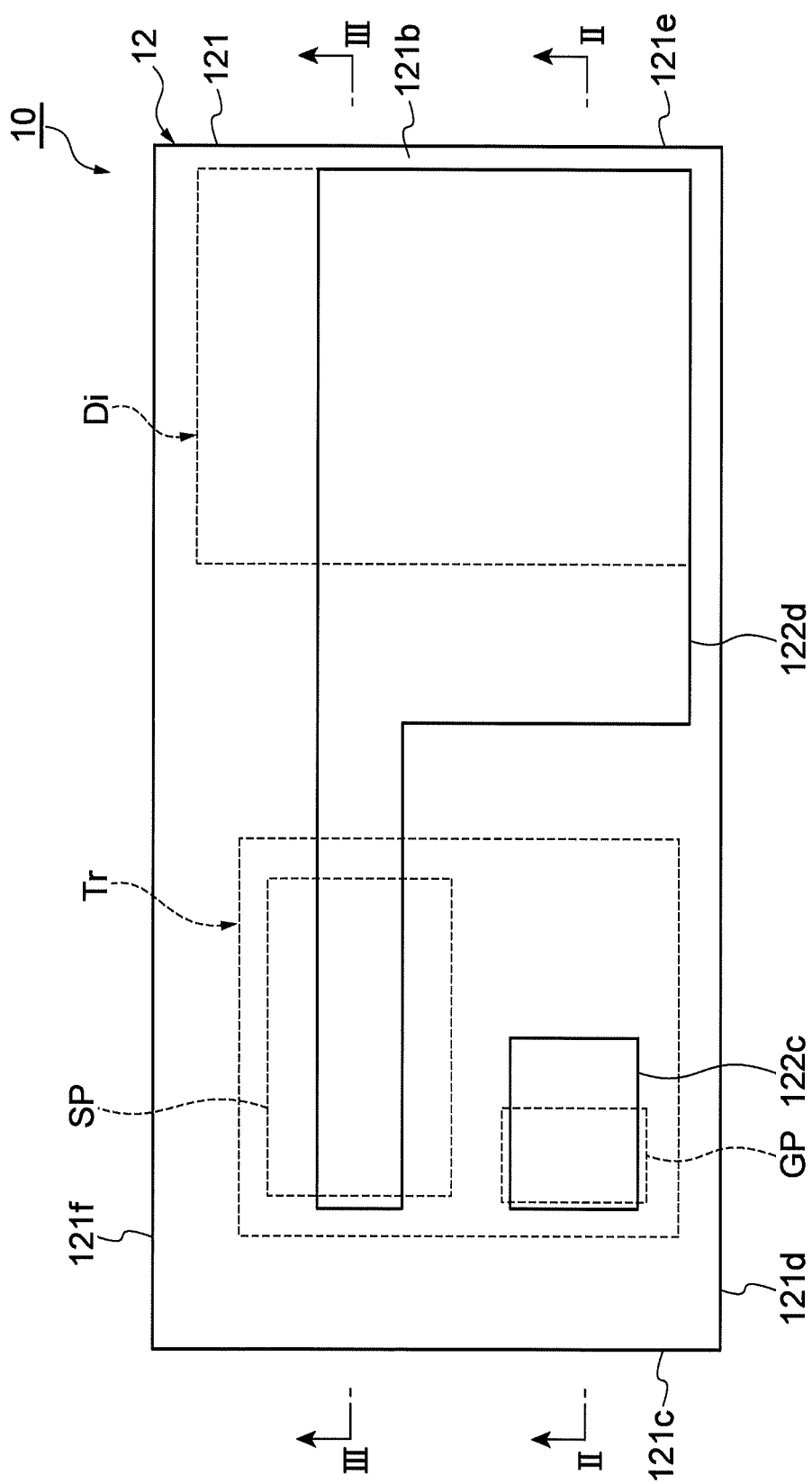
FIG. 1 is a plan view of a circuit unit included in a semiconductor module according to an embodiment.

Problems to Be Solved by the Present Disclosure

In a semiconductor module including a plurality of transistors and a plurality of diodes directly mounted on a circuit board, the semiconductor module needs to be inspected after the transistors and the diodes are mounted. In this case, when a malfunction occurs in mounting the transistors and the diodes, the plurality of transistors and the plurality of diodes have to be mounted again. Thus, a yield rate of the semiconductor module decreases.

Therefore, the present disclosure aims at providing a semiconductor module capable of improving a yield rate.

Embodiments of the present disclosure are described below with reference to the drawings. In the description of the drawings, same numerals are attached to the same components, and an overlapping description is omitted.

Description of Embodiments of the Present Disclosure

To begin with, embodiments of the present disclosure are listed and described below.

A semiconductor module according to one embodiment includes (A) a first insulating substrate, a first input interconnection pattern formed on a surface of the first insulating substrate, a second input interconnection pattern, a first circuit board including a first control interconnection pattern and a second control interconnection pattern; (B) N (N being an integer of two or more) circuit units mounted on the first circuit board; and (C) a first plate member disposed opposite to the first circuit board with respect to the N circuit units and including a back surface side conductive region, wherein the first circuit units includes: (a) a second plate member including a top surface side conductive region and a back surface side conductive region electrically connected to each other; (b) a vertical type transistor including a first main electrode pad, and a second main electrode pad and a gate electrode pad that are formed opposite to the first main electrode pad, wherein the first main electrode pad is opposite to and is electrically connected to the top surface side conductive region of the second plate member; (c) a second circuit board including a second insulating substrate, a first conductive pattern formed on a back surface of the second insulating substrate and electrically connected to the gate electrode pad, a second conductive pattern formed on the back surface of the second insulating substrate and electrically connected to the second main electrode pad, a third conductive pattern formed on a top surface of the second insulating substrate and electrically connected to the first conductive pattern, and a fourth conductive pattern formed on the top surface of the second insulating substrate and electrically connected to the second conductive pattern, wherein n (n being an integer of one or more and (N−1) or less) first circuit unit of the N circuit units is mounted on the first circuit board so that the back surface side conductive region of the second plate member is opposite to and is electrically connected to the first input interconnection pattern, wherein (N−n) second circuit unit of the N circuit units is mounted on the first circuit board so that the third conductive pattern of the second circuit board is opposite to and is electrically connected to the second control interconnection pattern and that the fourth conductive pattern of the second control interconnection pattern is opposite to and is electrically connected to the second input interconnection pattern, wherein the first plate member electrically connects the fourth conductive pattern of the second circuit board contained in the n first circuit unit to the second plate member contained in the (N−n) second circuit unit, and wherein the gate electrode pad of the vertical type transistor contained in the n first circuit unit is electrically connected to the first control interconnection pattern.

In the above-mentioned semiconductor module, n first circuit unit and (N−n) second circuit unit are electrically connected via a first circuit board and a first plate member as described above. The first circuit unit and the second circuit unit are circuit units including vertical type transistors. Accordingly, in manufacturing a semiconductor module, before mounting a circuit unit on the first circuit board, an inspection can be performed for the circuit unit as a unit. Thus, because a defective product can be removed in forming the circuit unit, a non-defective product of the circuit unit can be mounted on the first circuit board. Thus, a yield rate improves more than the case of directly mounting a plurality of vertical type transistors on the first circuit board, for example.

A position confirmation hole of the vertical type transistor may be formed in at least one of the second circuit board and the second plate member contained in the circuit units. In this case, in manufacturing the circuit units, an alignment between the vertical type transistor and the second circuit board is easy.

The circuit units may further include a circuit element disposed between the second plate member and the second circuit board and are electrically connected to the vertical type transistor via the second plate member and the second circuit board. In this case, the circuit units are circuit units in which the vertical type transistor is electrically connected to the circuit element via the second circuit board and the second plate member. Thus, for example a yield rate improves more than the case of directly mounting a plurality of vertical transistors and a plurality of circuit elements on the first circuit board.

The circuit element may include a first electrode pad that is opposite to and is electrically connected to the back surface of the second insulating substrate, and a second electrode pad that is formed opposite to the first electrode pad and is electrically connected to the top surface side conductive region of the second plate member.

The circuit element may be a diode; the first electrode pad may be an anode pad; and the second electrode pad may be a cathode pad. In this case, the circuit unit is a inverse-parallel circuit in which the vertical type transistor and the diode are inversely connected in parallel to each other, and the semiconductor module serves as a power converter circuit.

The semiconductor module may further include a surge voltage absorption device connecting the first input interconnection pattern to the second input interconnection pattern and configured to absorb a surge voltage. Thus, when the semiconductor module that serves as a power converter circuit is driven, a surge voltage that occurs between the first input interconnection pattern and the second input interconnection pattern can be reduced.

The first plate member may be a conductive plate, and the second plate member may be a conductive plate.

Details of Embodiments of the Present Invention

Specific examples of embodiments of the present disclosure are described below with reference to the drawings. The present disclosure is not limited to these illustrations, but is indicated by a scope of claims, and is intended to contain the scope of claims and its equivalents, and all changes in the scope. The same numerals are attached to the same components in a description of the drawings and an overlapping description is omitted. A proportion of size in the drawings does not necessarily coincide with that of the description.

A circuit unit 10 included in a semiconductor module according to an embodiment is described below using FIG. 1 to FIG. 5. The circuit unit 10 includes a transistor Tr, a diode (circuit device) Di, a conductive plate (second plate member) 11, and a circuit board 12.

The transistor Tr is a vertical type transistor, and has a chip-like shape, for example. Examples of a shape of the transistor Tr in a plan view is a rectangle or a square shape. Examples of a material of the transistor Tr includes a wideband gap semiconductor and Si such as SiC and GaN. The transistor Tr may be a MOSFET (Metal-Oxide-Semiconductor Field-Effect Transistor), or may be an insulated gate bipolar transistor (IGBT: Insulated Gate Bipolar Transistor). The transistor Tr is a MOSFET if it is not specifically referred to.

As illustrated in FIG. 1 to FIG. 4, the transistor Tr includes a drain electrode pad (first main electrode pad) DP, a source electrode pad (second main electrode pad) SP, and a gate electrode pad GP. The source electrode pad SP and the gate electrode pad GP are arranged opposite to the drain electrode pad DP in a thickness direction of the transistor Tr. In the transistor Tr, a conductive state between the source electrode pad SP and the drain electrode pad DP is controlled depending on a control signal applied to the gate electrode pad GP. Thus, the transistor Tr serves as a switching device.

The diode Di serves as a freewheeling diode for the transistor Tr. The diode Di includes a cathode CP, and an anode AP disposed opposite to the cathode CP. An example of the diode is a Schottky barrier diode.

The conductive plate 11 may be a plate member that is made of a conductive material. An example of the conductive plate 11 is a metal plate, and an example of a material of the conductive plate 11 is copper. An example of a shape in a plan view includes a rectangle or a square shape. Because the conductive plate 11 is made of a conductive material, a top surface 11a of the conductive plate 11 is a conductive region (top surface side conductive region); a back surface 11b is also a conductive region (back surface side conductive region); and the top surface 11a and the back surface 11b that are made of conductive regions are electrically connected to each other.

Figure 2:
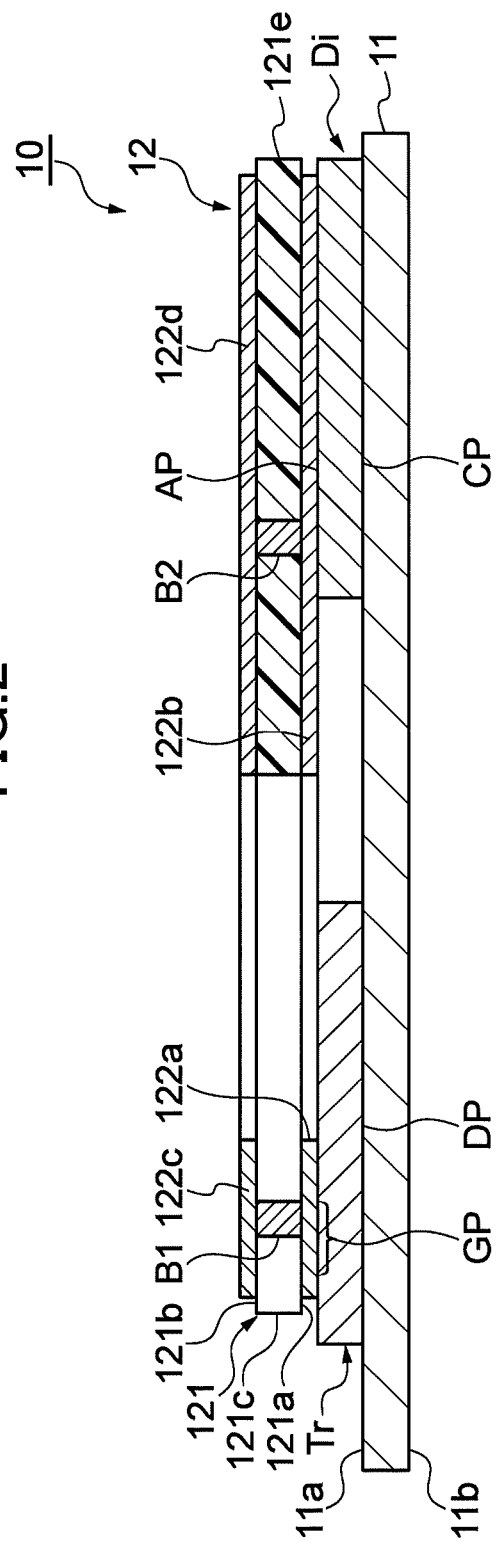
FIG. 2 is a schematic diagram of a cross section taken along line II-II in FIG. 1.
Figure 3:
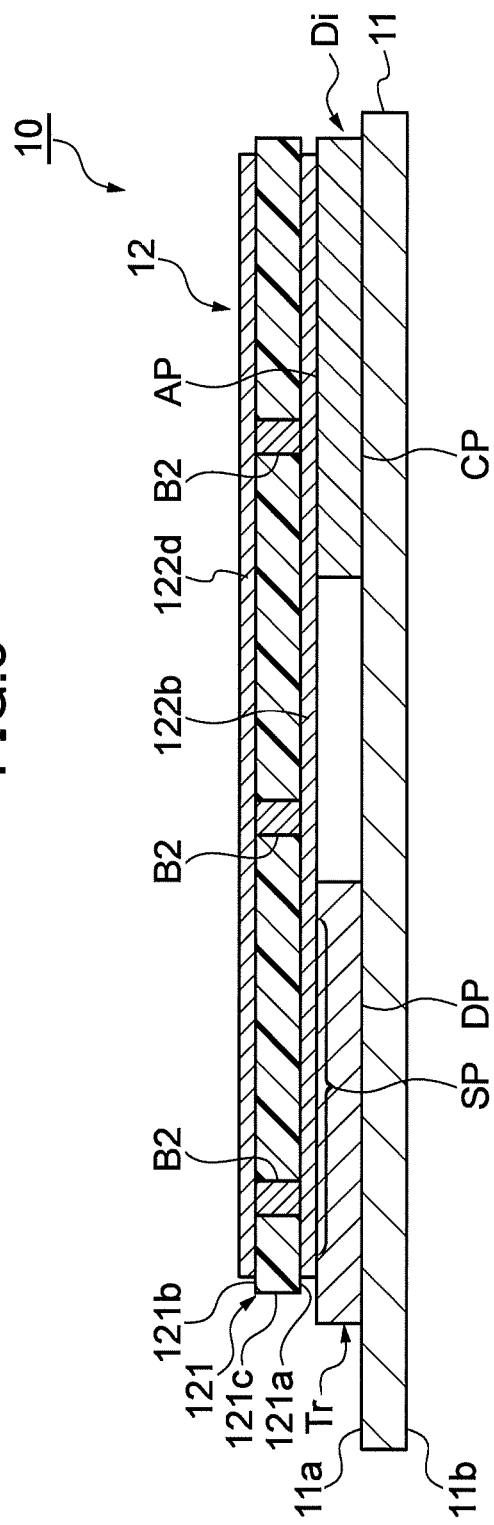
FIG. 3 is a schematic diagram of a cross section taken along line III-III line in FIG. 1.
Figure 4:
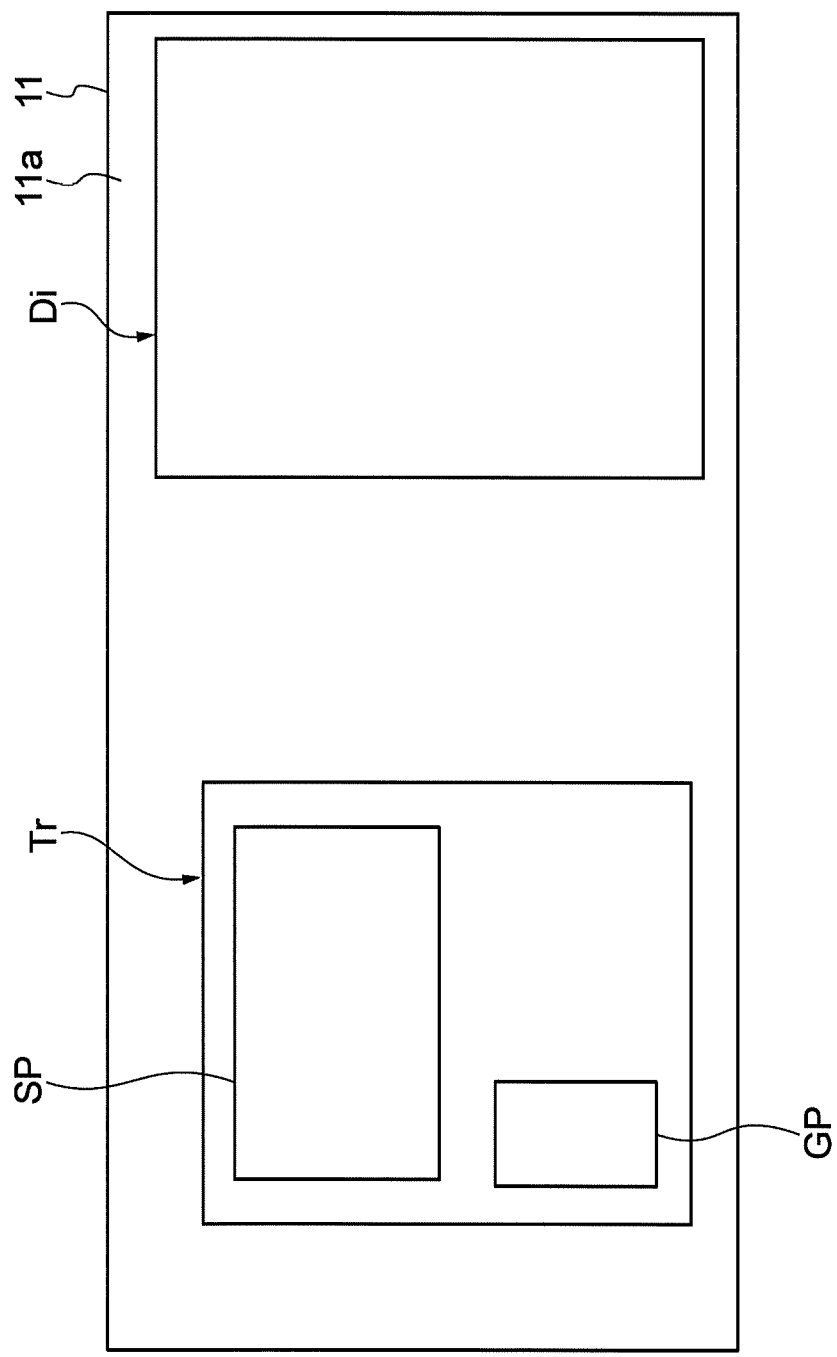
FIG. 4 is a diagram illustrating a state of removing a circuit board (second circuit board) from the circuit unit illustrated in FIG. 1.

As illustrated in FIG. 2 and FIG. 3, the circuit board 12 is disposed opposite to the transistor Tr and the diode Di. As illustrated in FIG. 1 to FIG. 5, the circuit board 12 includes an insulating substrate 121, a first conductive pattern 122a and a second conductive pattern 122b formed on a back surface 121a of the insulating substrate 121 (see FIG. 5), and a third conductive pattern 122c and a fourth conductive pattern 122d formed on a top surface 121b (surface opposite to the back surface 121a) of the insulating substrate 121 (see FIG. 1).

The insulating substrate 121 is, for example, a ceramic substrate. Example of a material includes AlN, SiN and Al$_2$O$_3$. A shape of the insulating substrate 121 in the thickness direction as seen from above or below is not limited, but a rectangle and a square shape are cited as examples.

The first conductive pattern 122a, the second conductive pattern 122b, the third conductive pattern 122c and the fourth conductive pattern 122d are, for example, conductive layers made of copper, for example. The first conductive pattern 122a, the second conductive pattern 122b, the third conductive pattern 122c and the fourth conductive pattern 122d serve as electrodes.

Figure 5:
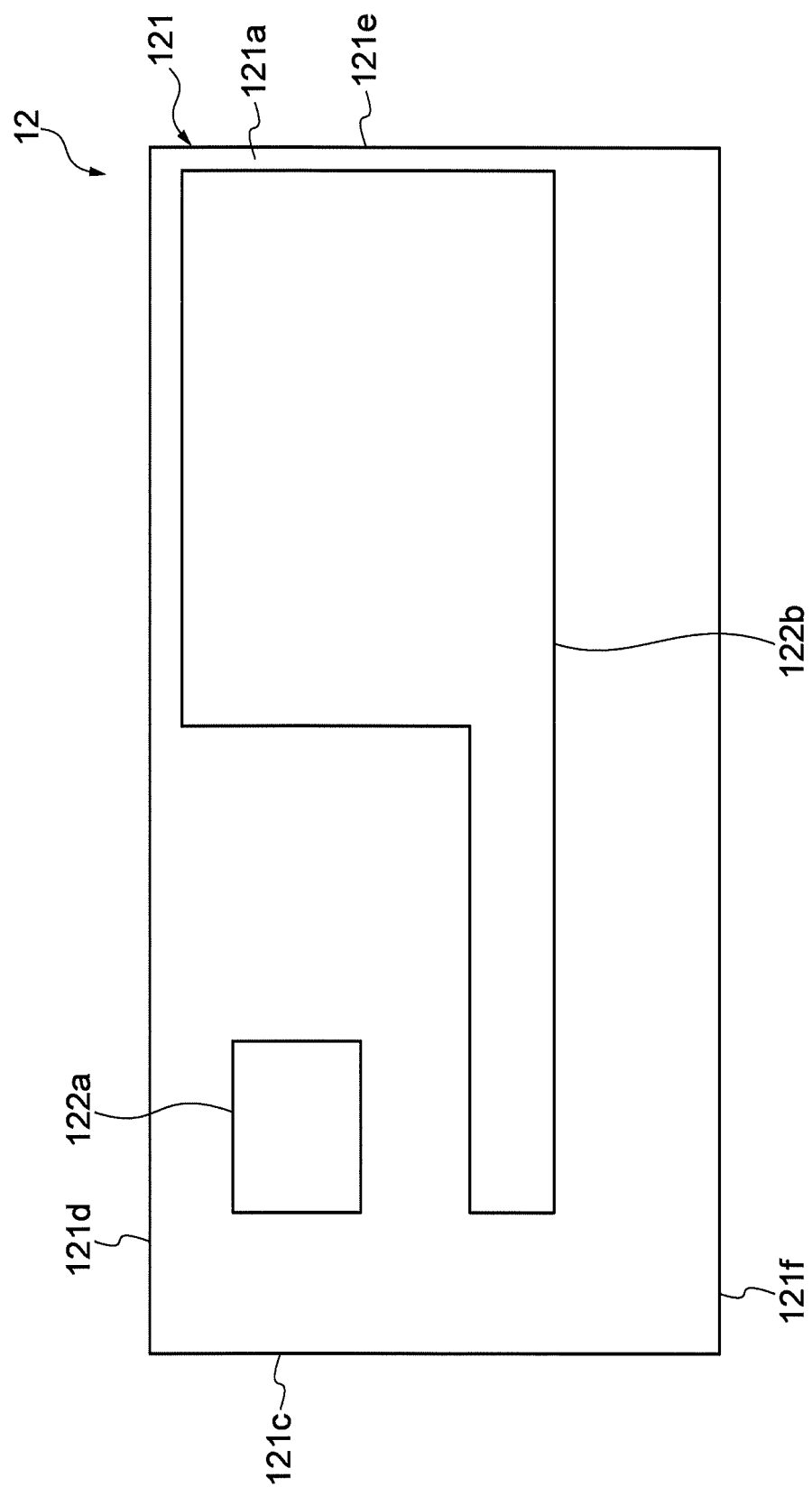
FIG. 5 is a plan view of a circuit board included in the circuit unit illustrated in FIG. 1 as seen from a back surface side of an insulating substrate included in the circuit board.

As illustrated in FIG. 2 and FIG. 5, the first conductive pattern 122a is disposed apart and insulated from the second conductive pattern 122b, and as illustrated in FIG. 1 and FIG. 2, the third conductive pattern 122c is disposed apart and insulated from the fourth conductive pattern 122d. As illustrated in FIG. 5, the first conductive pattern 122a is disposed close to an edge 121d in the vicinity of an edge 121c of the insulating substrate 121. A main part of the second conductive pattern 122b is disposed on a side of the edge 121e, and part of the second conductive pattern 122b is provided on a lateral side of an edge 121f relative to the first conductive pattern 122a and extends to a position close to the 121c. Similarly, as illustrated in FIG. 1, the third conductive pattern 122c is disposed close to the edge 121d in the vicinity of the edge 121c of the insulating substrate 121. A main part of the fourth conductive pattern 122d is disposed on the side of the edge 121e of the insulating substrate 121, and part of the fourth conductive pattern 122d is provided on the lateral side of the edge 121f relative to the third conductive pattern 122c and extends to a position close to the edge 121c.

The first conductive pattern 122a and the third conductive pattern 122c are electrically connected to each other, and the second conductive pattern 122b and the fourth conductive pattern 122d are electrically connected to each other. As illustrated in FIG. 2, the electrical connection between the first conductive pattern 122a and the third conductive pattern 122c can be achieved using at least one via hole B1, which is a through hole penetrating through the insulating substrate 121 in the thickness direction, filled with a conductive material. Similarly, for example, as illustrated in FIG. 2 and FIG. 3, the electrical connection between the second conductive pattern 122b and the fourth conductive pattern 122d can be achieved using at least one via hole B2. The conductive material constituting the via hole B1 may be the same as a material of the second conductive pattern 122b or the fourth conductive pattern 122d, or may be different from the material of the second conductive pattern 122b or the fourth conductive pattern 122d.

The electrical connection between the first conductive pattern 122a and the third conductive pattern 122c, and the electrical connection between the second conductive pattern 122b and the fourth conductive pattern 122d are not limited to a form of using the via hole B1 and the via hole B2, and for example, the electrical connection may be achieved by using lateral surface metalizing, a half via hole and the like.

In the circuit unit 10, the transistor Tr and the diode Di are disposed between the conductive plate 11 and the circuit board 12 so that the drain electrode pad DP and the cathode CP of the diode DP face the top surface 11a of the conductive plate 11, and that the source electrode pad SP and the gate electrode pad GP of the transistor Tr and the anode AP of the diode Di face the back surface 121a of the insulating substrate 121.

Then, the drain electrode pad DP of the transistor Tr is electrically connected to the top surface 11a of the conductive plate 11; the gate electrode pad GP is electrically connected to the first conductive pattern 122a; and the source electrode pad SP is electrically connected to the second conductive pattern 122b. The cathode CP of the diode Di is electrically connected to the top surface 11a of the conductive plate 11, and the anode AP of the diode Di is electrically connected to the second conductive pattern 122b. The above electrical connection between the transistor Tr and the diode Di, and the conductive plate 11 and the circuit board 12, can be achieved by a conductive joint material such as solder. Thus, the transistor Tr and the diode Di are fixed to the conductive plate 11 and the circuit board 12.

In the above configuration, the circuit unit 10 is a parallel circuit in which the diode Di is connected to the transistor Tr by inverse-parallel connection. In the circuit unit 10, the conductive plate 11 serves as an electrode (electrode terminal) to supply power to the drain electrode pad DP (and the cathode CP); the third electrode pattern 122c serves as an electrode (electrode terminal) to supply a control signal to the gate electrode pad GP; and the fourth conductive pattern 122d serves as an electrode (electrode terminal) to supply power to the source electrode pad SP (and the anode AP).

Arrangements and shapes of the first conductive pattern 122a and the second conductive pattern 122b in the back surface 121a may not be the same as shapes and arrangements of the third conductive pattern 122c and the fourth conductive pattern 122d. The arrangements and the shapes of the first conductive pattern 122a and the second conductive pattern 122b may be arrangements and shapes in which the above connection relationship between the transistor Tr and the diode Di, and the circuit board 12, can be achieved.

The shapes and arrangements of the third conductive pattern 122c and the fourth conductive pattern 122d may be designed while considering readiness of the electrical connection in configuring the semiconductor module using the circuit unit 10.

Figure 6:
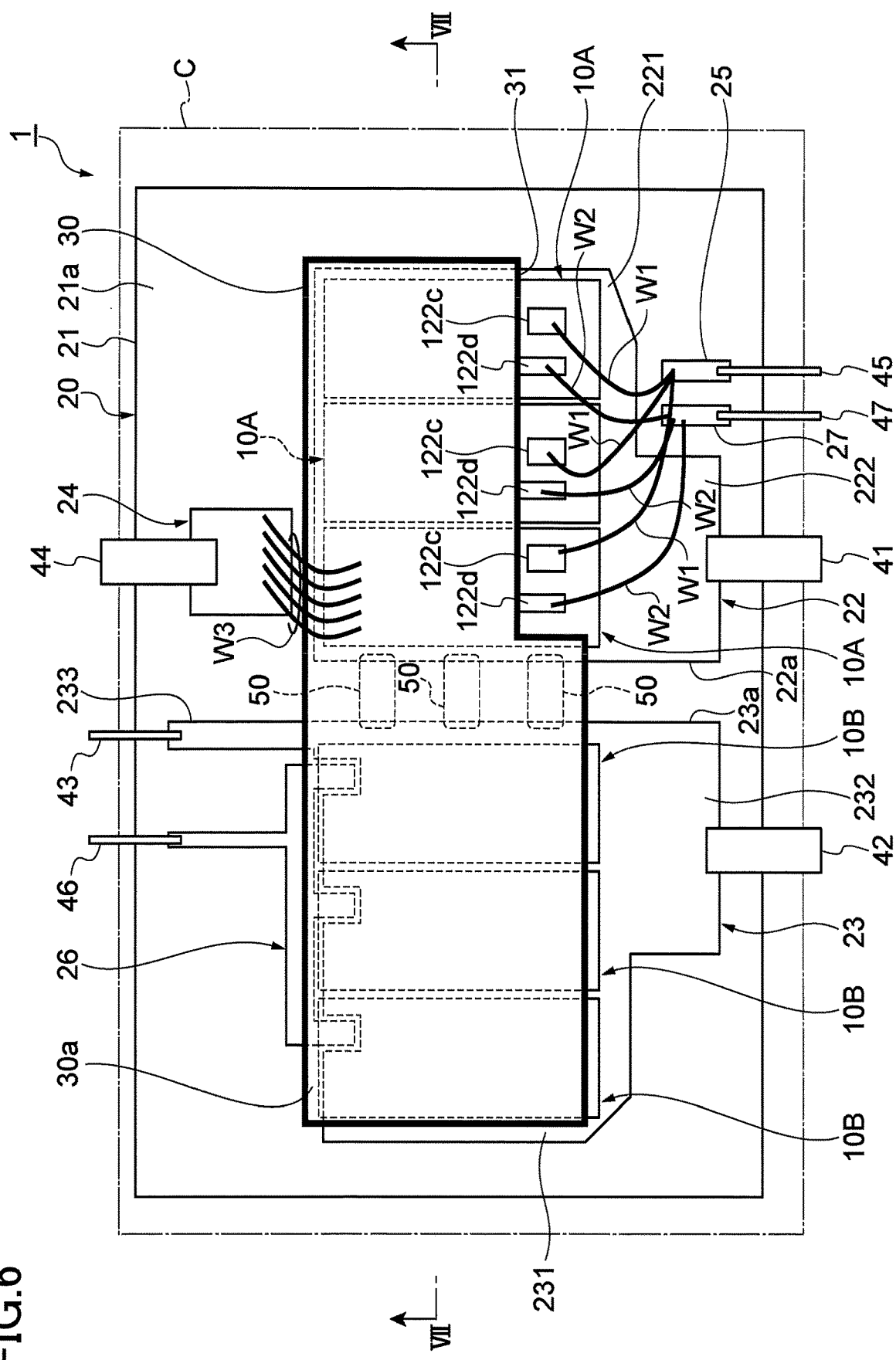
FIG. 6 is a schematic diagram illustrating a configuration of a semiconductor module according to an embodiment.
Figure 7:
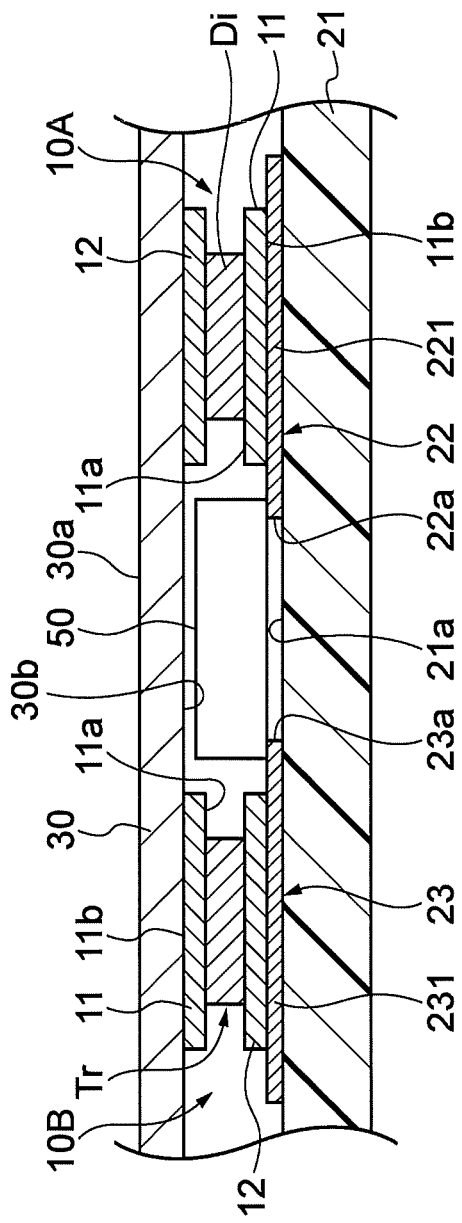
FIG. 7 is a partial enlarged diagram of a cross-sectional configuration taken along line VII-VII in FIG. 6.

Next, a semiconductor module 1 including N (N is an integer of two or more) circuit units 10 is described below mainly using FIG. 6 to FIG. 9. The semiconductor module 1 serves as a power converter circuit such as an inverter circuit, and the plurality of circuit units 10 include circuit units on an upper arm side and circuit units on a lower arm side in the power converter circuit. In the following description, the circuit unit on the upper arm side in the power convertor circuit is referred to as a first circuit unit 10A, and the circuit unit on the lower arm side is referred to as a second circuit unit 10B. In FIG. 7, circuit boards 12 included in the first circuit unit 10A and the second circuit unit 10B are schematically simplified and illustrated.

The semiconductor module 1 includes a circuit board 20, n (n is an integer of one or more and (N−1) or less) first circuit units 10A, (N−n) second circuit units 10B, and a conductive plate (first plate member) 30. FIG. 6 shows the case of N=6, and illustrates the case of n=3. The case of n equal to two or more is described below. Hence, the n first circuit units 10A may be referred to as a plurality of first circuit units 10A, and the (N−n) second circuit units 10B may be referred to as a plurality of second circuit units 10B.

The semiconductor module 1 may include at least one surge voltage absorption device 50. Moreover, the semiconductor module 1 may include the circuit board 20, and a case C that accommodates the first circuit units 10A mounted on the circuit board 20. A form of the semiconductor module 1 including three surge voltage absorption devices 50 and the case C is described below without any specific remark.

Figure 8:
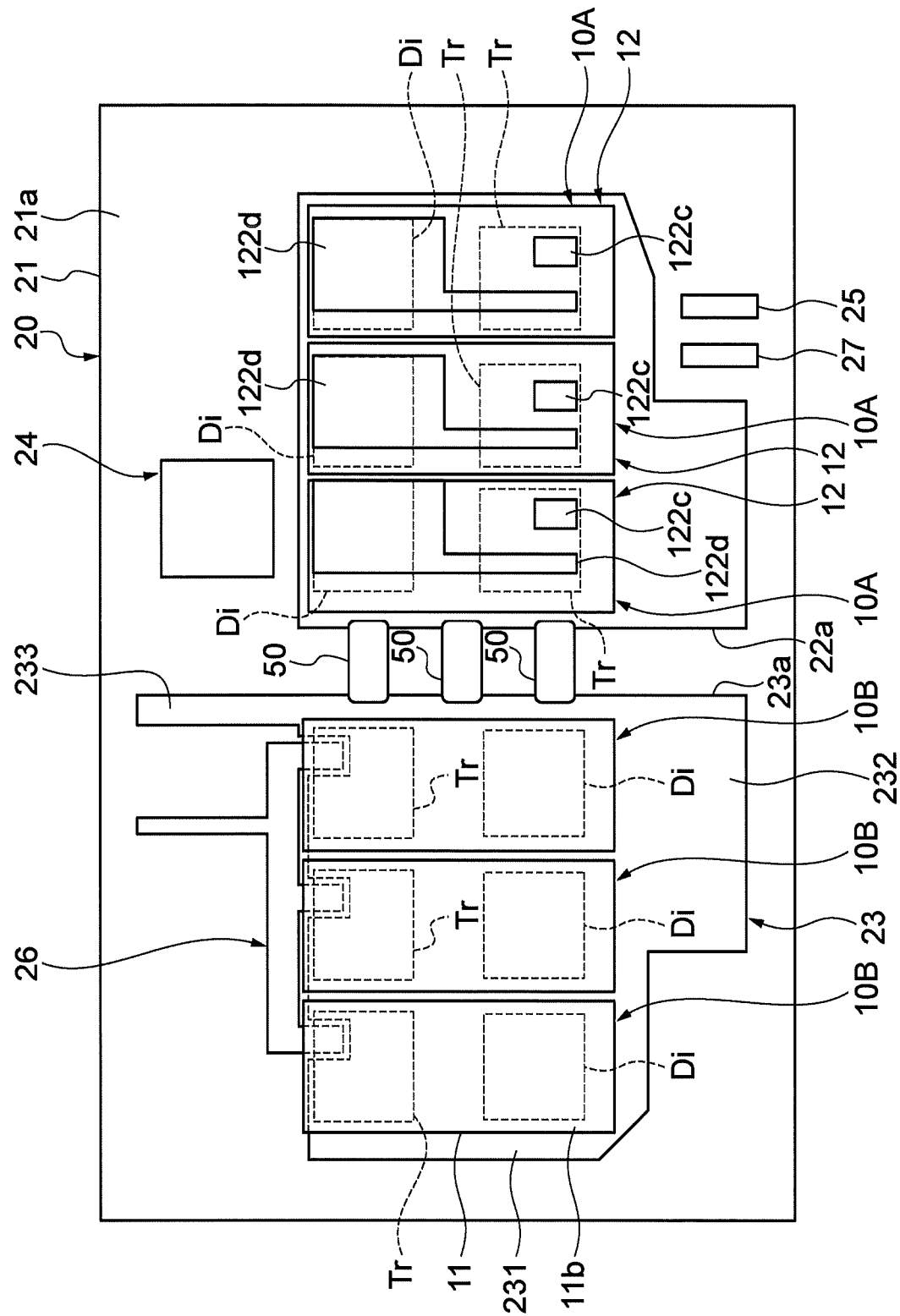
FIG. 8 is a diagram illustrating a configuration of a circuit board included in the semiconductor module illustrated in FIG. 6, and illustrates a state of removing a conductive plate (first plate member) included in the semiconductor module.
Figure 9:
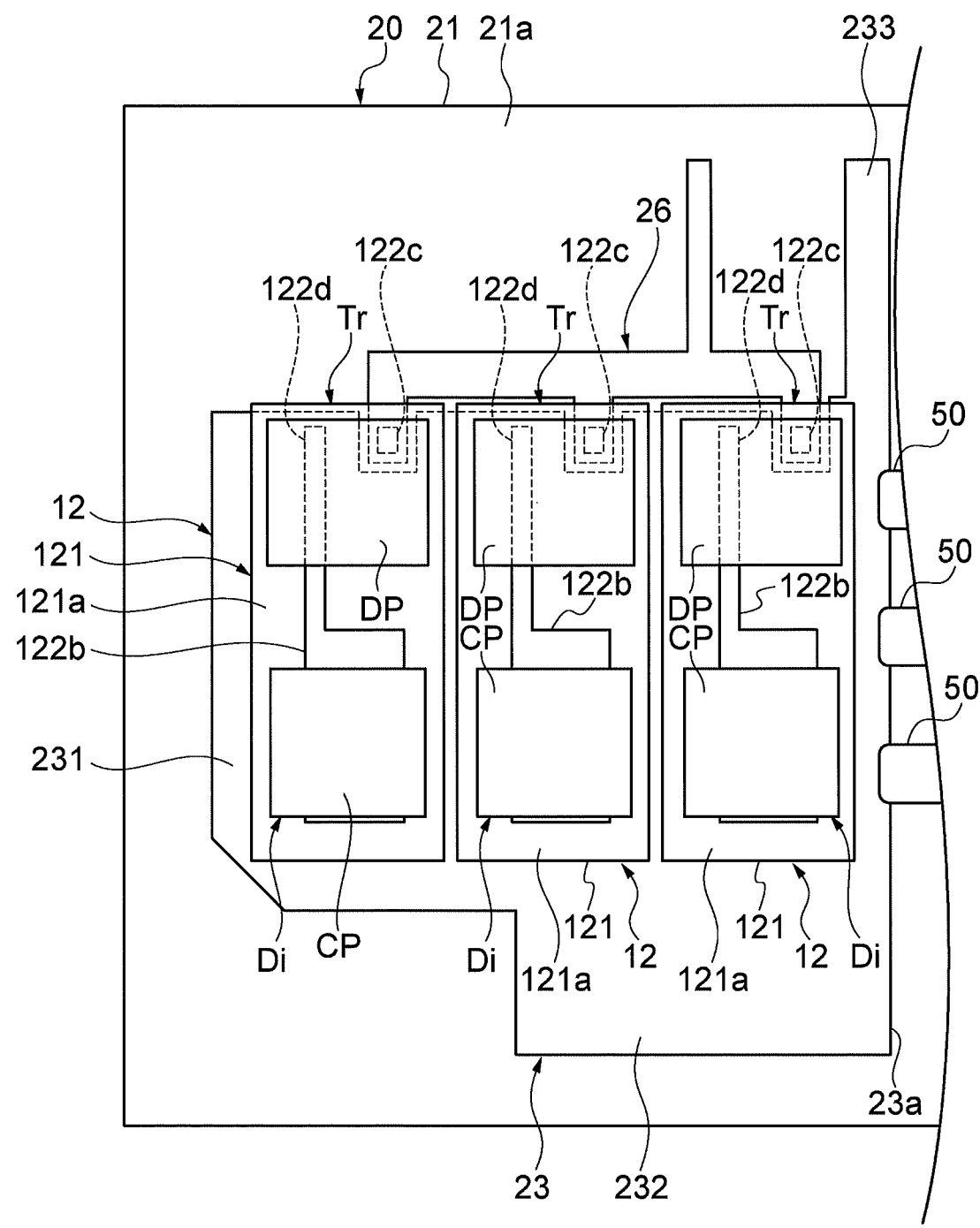
FIG. 9 is a diagram for explaining a state of mounting a second circuit unit included in the semiconductor module illustrated in FIG. 6, and illustrates a state of removing the conductive plate (first plate member) included in the semiconductor unit and the conductive plate (second plate member) included in the circuit unit.

In FIG. 6, the case C is schematically illustrated by a dashed and dotted line. In FIG. 7 to FIG. 9, the depiction of case C and wires is omitted. The case C may be made of resin, for example. The case C includes a radiator plate on which the circuit board 20 is mounted as a bottom plate, and may be constituted of the bottom plate, and a cover that is made of resin and covers the circuit board 20 and the like. Structures on the circuit board 20 accommodated in the case C (first circuit units 10A, second circuit units 10B and the like) are buried under silicone gel, for example.

The circuit board 20 includes an insulating substrate 21, and a P pad 22, an N pad 23, an 0 pad 24, a pad for a first control signal 25, and a pad for a second control signal 26 are formed on a surface 21a of the insulating substrate 21. An auxiliary pad 27 may be formed on the surface 21a. A form in which the auxiliary pad 27 is formed is described below without any specific remarks.

The insulating substrate 21 is, for example, a ceramic substrate. Examples of materials of the insulating substrate 21 include AlN, SiN, and $Al_2O_3$. A shape of the insulating substrate 21 in a thickness direction is not limited, but, for example, a rectangle and a square shape are cited as examples. A radiator layer made of copper and the like may be formed on a back surface of the insulating substrate 21 (opposite side to a surface on which the first circuit units 10A, the second circuit units 10B and the like are mounted).

The P pad (interconnection pattern for first input) 22 includes a first unit mounting region 221, and an external connection region 222, and for example, is made of a metal layer. The first unit mounting region 221 is a region on which a plurality of first circuit units 10A is mounted. The external connection region 222 is continuously formed from the first unit mounting region 221, and is a region to which one end of the positive voltage terminal 41 is connected. The other end of the positive voltage terminal 41 is dragged to the outside of the case C.

The N pad (interconnection pattern for second input) 23 includes a second unit mounting region 231, and an external connection region 232, and for example, is made of a metal layer. The second unit mounting region 231 is a region on which a plurality of second circuit units 10B is mounted. The external connection region 233 is continuously formed from the second unit mounting region 231, and is a region to which one end of the second preliminary terminal 43 is connected. In the present embodiment, the second external connection region 233 is disposed opposite to the first external connection region 232 relative to the second unit mounting region 231. The other ends of the negative voltage terminal 42 and the second preliminary terminal 43 are dragged to the outside of the case C.

The N pad 23 is disposed adjacent to the P pad 22 so as to face the P pad 22. Specifically, the N pad 23 is disposed so that an edge (opposite edge) 23a faces an edge (opposite edge) 22a in parallel.

The O pad (output interconnection pattern) 24 is a pad to which one end of the output terminal 44 is connected, and is a conductive layer, for example, made of copper. In the present embodiment, the 0 pad 24 is disposed opposite to the external connection region 222 relative to the first mounting region 221 in the P pad 22 and a lateral side of the second external connection region 233. The other end of the output terminal 44 is dragged to the outside of the case C.

The pad for the first control signal (interconnection pattern for the first control) 25 is a pad to which one end of the first control terminal 45 is connected, and is a metal layer, for example, made of copper. In the present embodiment, the pad for the first control signal 25 is disposed on a lateral side of the external interconnection 222. The other end of the first control terminal 45 is dragged to the outside of the case C.

The pad for the second control signal (interconnection pattern for the second control) 26 is a pad to which one end of the second control terminal 46 is connected, and is a conductive layer, for example, made of copper. In the present embodiment, the pad for the second control signal 26 is disposed on a lateral side of the external interconnection 222. The other end of the first control terminal 45 is dragged to the outside of the case C.

The auxiliary pad 27 is a pad to which one end of the first auxiliary terminal 47 is connected, and is a metal layer, for example, made of copper. In the present embodiment, the auxiliary pad 27 is disposed between the pad for the first control signal 25 and the external connection region 222. The other end of the first auxiliary terminal 47 is dragged to the outside of the case C.

The shapes and the arrangements of above-described pad (the P pad 22, the N pad 23, the 0 pad 24 and the like) formed on the surface 21a of the insulating substrate 21 are not limited to the forms illustrated in FIG. 6 to FIG. 8, and may be appropriately set while considering the mounting readiness and the wiring readiness of the first circuit units 10A and the second circuit units 10B.

The plurality of first circuit units 10A is arranged apart from each other. The first circuit units 10A are mounted on the circuit board 20 so that the back surface 11b opposite to the surface on which the transistor Tr and the like are mounted in the conductive plate 11, faces the first unit mounting region 221 of the P pad 22 and is electrically connected to the first unit mounting region 221 (FIG. 7 to FIG. 9). The conductive plate 11 can be fixed to the first unit mounting region 221 via a conductive joint material such as solder.

In this configuration, as illustrated in FIG. 8, the third conductive pattern 122c and the fourth conductive pattern 122d of the first circuit unit 10A are arranged on the opposite side of the circuit board 20 as seen from the first circuit unit 10A. As illustrated in FIG. 6, the third conductive patterns 122c of the first circuit units 10A are connected to the pad for the first control signal 25 via first wires W1. For example, a wire, a ribbon and the like are cited as the first wire W1. The fourth conductive patterns 122d of the first circuit units 10A are connected to the auxiliary pad 27 via second wires W2. The first wires W1 and the second wires W2 are examples of connection materials, and a variety of connection member or an interconnection can be used as long as the third conductive patterns 122c can be electrically connected to the pad for the first control signal, and as long as the fourth conductive patterns 122d can be electrically connected to the auxiliary pad 27.

The conductive plates 11 of the first circuit units 10A is electrically connected to the P pad 22, and the drain electrode pads DP of the transistors Tr and the cathodes CP of the diodes Di are electrically connected to the conductive plates 11. Hence, a positive voltage is input to the drain electrode pads DP of the transistors Tr and the cathodes CP of the diodes Di that are included in the first circuit units 10A via the positive voltage terminal 41.

Because the third conductive patterns 122c of the first circuit units 10A are electrically connected to the pad for the first control signal 25 through the first wires W1 and because the third conductive patterns 122c are electrically connected to the first conductive patterns 122a, a control signal is input to the gate pads GP of the transistors Tr included in the first circuit units 10A via the first control terminal 45. Because the fourth conductive patterns 122d of the first circuit units 10A are connected to the auxiliary pad 27 via the second wires W2, potential of the source pad electrodes SP of the transistors Tr included in the first circuit units 10A can be taken out of the first auxiliary terminal 47. The potential taken through the first auxiliary terminal 47 can be utilized to generate a control signal of the transistors Tr included in the first circuit units 10A, for example.

The second circuit units 10B are mounted on the circuit board 20 so that the circuit board 12 faces the circuit board 20. Specifically, as illustrated in FIG. 9, the second circuit units 10B are mounted on the circuit board 20 so that the third conductive pattern 12 of the second circuit units 10B faces the pad for the second control signal 26 and is electrically connected to the pad for the second control signal 26 and that the fourth conductive patterns 122d face the second unit mounting region 231 of the N pad 23 and is electrically connected to the second unit mounting region 231. Hence, the pad for the second control signal 26 and the N pad 23 may be formed into a shape such that the above connection is possible. For example, the N pad 23 and the pad for the second control signal 26 can be formed so that the N pad 23 has a cut-out part and that part of the pad for the second control signal 26 is disposed at a distance from the N pad 23 in the cut-out part.

The third conductive patterns 122c of the second circuit units 10B are connected to the pad for the second control signal 26, for example, by flip chip bonding. The fourth conductive patterns 122d of the second circuit units 10B are connected to the second unit mounting region 231 via a conductive joint material such as solder. In such a mounting state of the second circuit units 10B, as illustrated in FIG. 7 and FIG. 8, the conductive plates 11 of the second circuit units 10B are located opposite to the circuit board 20.

The third conductive patterns 122c of the second circuit units 10B are electrically connected to the pad for the second control signal 26, and as illustrated in FIG. 2, the third conductive patterns 122c are electrically connected to the gate electrode pads GP of the transistors Tr. Hence, a control signal can be input to the gate electrode pads GP of the transistors Tr included in the second circuit units 10B via the second control terminal 46.

The fourth conductive patterns 122d of the second circuit units 10B are electrically connected to the N pad 23, and as illustrated in FIG. 3, the fourth conductive patterns 122d are electrically connected to the source electrode pads SP of the transistors Tr and the anodes AP of the diodes Di. Hence, a negative voltage can be input to the source electrode pads SP of the transistors Tr and the anodes AP of the diodes Di included in the second circuit units 10B via the negative voltage terminal 42, and the potential of the source electrode pads SP of the transistors Tr included in the second circuit units 10B can be taken out via the second auxiliary terminal 43. The potential taken out via the second auxiliary terminal 43 can be utilized to generate the control signal of the transistors Tr included in the second circuit units 10B, for example.

The surge voltage absorption device 50 is a device to absorb a surge voltage. An example of the surge voltage absorption device 50 is a capacitor, and an example of the surge voltage absorption capacitor is a ceramic capacitor. The capacitor of the surge absorption capacitor may be a capacitance that can store an estimated surge voltage.

As illustrated in FIG. 6 to FIG. 8, the surge voltage absorption devices 50 are connected to the edge 22a of the P pad 22a and the edge 23a of the N pad 23. Specifically, each end of the surge voltage absorption devices 50 is connected to part of the first unit mounting region 221 of the edge 22a, and each of the other ends is connected to part of the second unit mounting region 231 of the edge 23a. The multiple surge voltage absorption devices 50 are discretely arranged in an extending direction of the edge 22a (edge 23a).

The conductive plate 30 are provided on the plurality of first circuit units 10A and the plurality of second circuit units 10B so that the plurality of first circuit units 10A and the plurality of second circuit units 10B are sandwiched between the circuit board 20 and the conductive plate 30. The conductive plate 30 may be a plate-like member made of a conductive material, for example, a metal plate. Copper is cited as a material of the conductive plate 30. Because the conductive plate 30 is made of a conductive material, the top surface 30a of the conductive plate 30 is a conductive region (top surface side conductive region); the back surface 30b is also a conductive region (back surface side conductive region); and the top surface 30a and the back surface 30b are electrically connected to each other.

As illustrated in FIG. 6, the conductive plate 30 has a cut-out part 31 to connect the plurality of third conductive patterns 122c and fourth conductive patterns 122d of the first circuit units 10A to the pad for the first control signal 25 and the auxiliary pad 27 via the first wires W1 and the second wires W2. FIG. 6, for example, illustrates a form of cutting a region containing a corner of the conductive plate having a rectangular shape. Due to the cut-out part 31, part of the third conductive patterns 122c and the fourth conductive patterns 122d are exposed without being covered with the conductive plate 30, thereby connecting the third conductive patterns 122c and the fourth conductive patterns 122d to the pad for the first control signal 25 and the auxiliary pad 27.

The conductive plate 30 is disposed on the first circuit units 10A and the second circuit units 10B so that part of the third conductive patterns 122c of the first circuit units 10A and the fourth conductive patterns 122d are exposed from the cut-out part 31.

The conductive plate 30 is fixed and electrically connected to the fourth conductive patterns 122d of the first circuit units 10A and the conductive plates 11 of the second circuit units 10B by a conductive joint material such as solder. In other words, the fourth conductive patterns 122d of the first circuit units 10A and the conductive plates 11 of the second circuit units 10B are electrically connected to each other via the conductive plate 30.

The conductive plate 30 is connected to the 0 pads 24 via third wires W3. For example, a wire and a ribbon are cited as the third wire W3. Because a great current is likely to flow between the conductive plate 30 and the 0 pads 24, when the third wires W3 are, for example, wires, the conductive plate 30 and the 0 pads 24 may be connected to each other via a plurality of wires or a small copper plate. Thus, the third wire W3 is an example of a connection member, and a variety of connection members or wiring materials may be used as long as the conductive plate 30 and the 0 pads 24 are electrically connected to each other.

Figure 10:
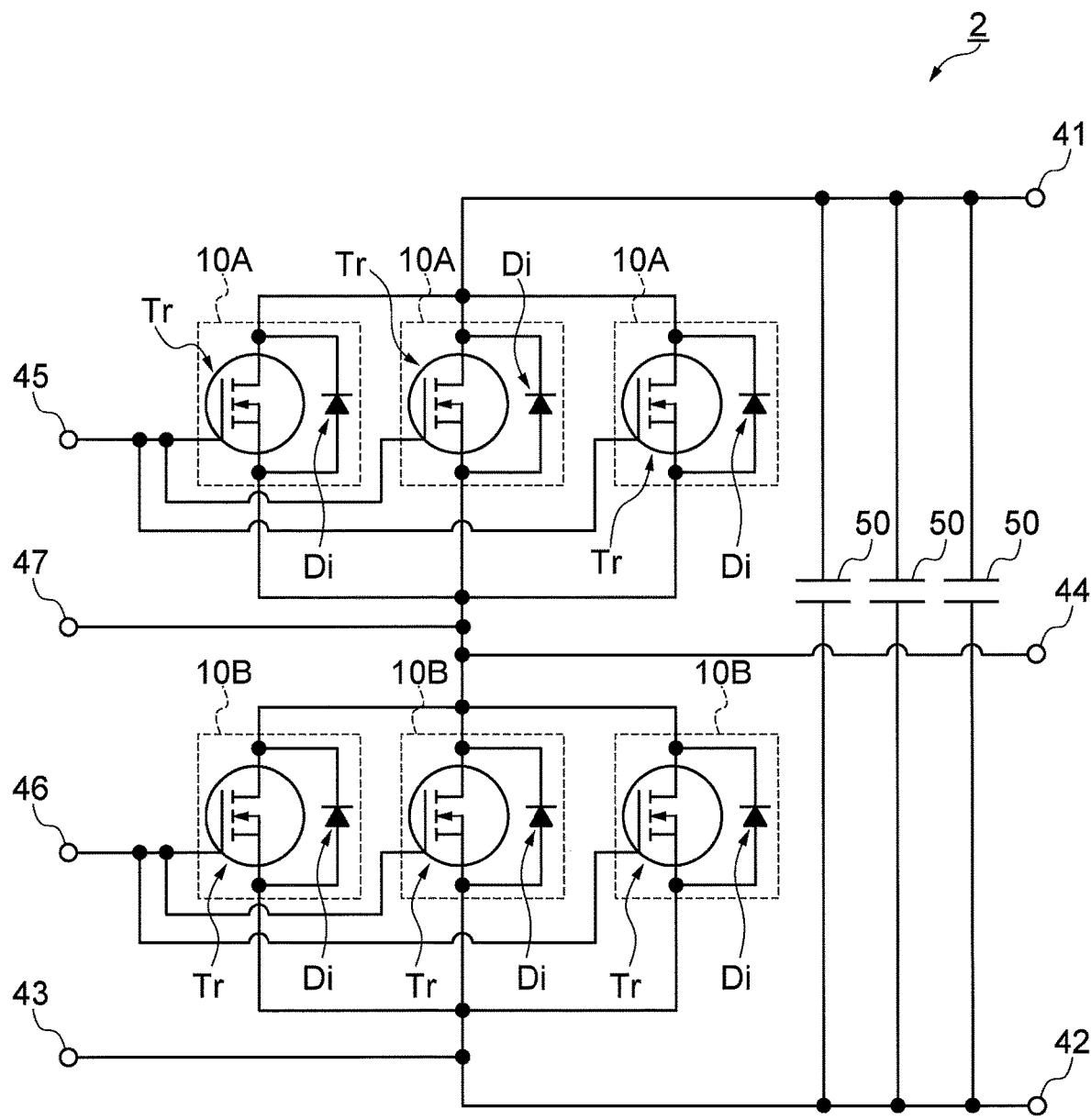
FIG. 10 is a diagram illustrating an equivalent circuit of a semiconductor module illustrated in FIG. 6.

In the above configuration, the plurality of first circuit units 10A are connected in parallel to each other, and the plurality of second circuit units 10B are connected in parallel to each other. Moreover, the first circuit units 10A connected in parallel and the second circuit units 10B connected in parallel are electrically connected in series. Then, each of the first circuit units 10A and each of the second circuit units 10B is a parallel circuit of the transistor Tr and the diode Di that is inversely connected to the transistor Tr in parallel. Hence, the semiconductor module 1 serves as a power converter circuit such as an equivalent circuit of the semiconductor module 1 illustrated in FIG. 10. A power convertor circuit 2 illustrated in FIG. 10 is a single-phase inverter, and in this case, the semiconductor module 1 is, for example, a semiconductor module of a 2 in 1 type. In FIG. 10, the same reference is attached to elements corresponding to the elements of the semiconductor module 1.

In the semiconductor module 1, the conductive plates 11 of the first circuit units 10A are electrically connected to the P pad 22, and the fourth conductive patterns 122d of the second circuit units 10B are electrically connected to the N pad 23. Accordingly, the power can be supplied to the first circuit units 10A and the second circuit units 10B that are electrically connected to the positive voltage terminal 41 and the negative voltage terminal 42 in series by way of the positive voltage terminal 41 and the negative voltage terminal 42.

Moreover, because the third conductive patterns 122c of the first circuit units 10A and the third conductive patterns 122c of the second circuit units 10B are electrically connected to the first control terminal 45 and the second control terminal 46, respectively, control signals can be provided for gate pads GP of the transistors Tr contained in the first circuit units 10A and the second circuit units 10B via the first control terminal 45 and the second control terminal 46.

Hence, in the semiconductor module 1, by alternately turning on and off the transistors Tr of the first circuit units 10A and the transistors Tr of the second circuit units 10B, a direct voltage applied between the positive voltage terminal 41 and the negative voltage terminal 42 can be converted to an alternating voltage. Because the conductive plate 30 is connected to the P pad 24 via the third wires W3, the converted alternating voltage can be taken out via the output terminal 44.

The semiconductor module 1 includes N circuit units 10 composed of n first circuit units 10A and (N-n) second circuit units 10B, and each of the circuit units 10 forms a parallel circuit of a transistor Tr and a diode Di. Hence, an inspection of the parallel circuit of the transistor Tr and the diode Di can be executed for the circuit unit 10 as a unit. Thus, by inspecting each of the circuit units 10 in the course before mounting the plurality of circuit units 10 on the circuit board 20 or after mounting the plurality of circuit units 10, for example, mounting only the circuit units 10 that do not have a mounting defect, or replacing the circuit units 10 that have a mounting defect is possible. As a result, for example, a yield rate of the semiconductor module 1 as a whole can be more improved than the case where a plurality of transistors Tr and a plurality of diodes Di are directly mounted on the circuit board 20 and then inspected.

The second circuit units 10B are mounted on the circuit board 20 so that the circuit board 12 faces the circuit board 20. On this occasion, the third conductive patterns 122c face the pad for the second control signal 26 and are electrically connected, and the fourth conductive patterns 122d face the second unit mounting region 231 of the N pad 23 and are electrically connected. Such an arrangement and an electric connection relationship cause the gate electrode pads GP of the transistors contained in the second circuit units 10B to be electrically connected to the second circuit control pad 26, and cause the source electrode pads SP to be electrically connected to the N pad 23.

When the second circuit units 10B are mounted on the circuit board 20, a certain degree of accuracy is required for alignment between the pad for the second control signal 26 and the N pad 23 so that the gate electrode pads GP and the source electrode pads SP of the transistors Tr contained in the second circuit units 10B do not short.

In the configuration of second circuit unit 10B, because the third conductive pattern 122c and the fourth conductive pattern 122d are electrically connected to the gate electrode pad GP and the source electrode pad SP via the first conductive pattern 122c and the second conductive pattern 122b, the arrangement and shape of the third conductive pattern 122c and the fourth conductive pattern 122d do not depend on the positions of the gate electrode pad GP and the source electrode pad SP in the transistor Tr. Hence, in the configuration of the second circuit unit 10B, the third conductive pattern 122c and the fourth conductive pattern 122d can be determined while considering the easiness of mounting the third conductive pattern 122c and the fourth conductive pattern 122d on the circuit board 20. Hence, requirements of accuracy of the alignment in mounting the second circuit unit 10B on the circuit board 20 in a state of the circuit board 20 facing the circuit board 20 can be decreased compared to, for example, the case of directly mounting the transistor Tr on the circuit board 20, thereby becoming easy to mount the second circuit unit 10B on the circuit board 20.

In the power converter circuit 2 containing the first circuit unit 10A and the second circuit unit 10B connected in series between the positive voltage terminal 41 and the negative voltage terminal 42, a surge voltage occurs when the transistor Tr of the first circuit unit 10A and the transistor Tr of the second circuit unit 10B are turned on or turned off.

In the form of the semiconductor module 1 including the surge voltage absorption device 50, the first unit mounting region 221 of the P pad 22 and the second unit mounting region 231 of the N pad 23 are connected to the surge voltage absorption device 50. Hence, as illustrated in FIG. 10, the surge voltage absorption devices 50 are electrically connected in parallel to the first circuit units 10A and the second circuit units 10B that are electrically connected between the positive voltage terminal 41 and the negative voltage terminal 42 in series. Thus, the surge voltage absorption devices 50 can absorbs the surge voltage in the configuration of the semiconductor module 1.

A magnitude of a surge voltage is determined by L*di/dt when a current is made I, and an inductance is made L. The inductance that determines the magnitude of the surge voltage includes an interconnection inductance of a path through which the current I passes. The di/dt depends on a switching speed of the transistors Tr contained in the first circuit unit 10A and the second circuit unit 10B. Because the switching speed has been developed to increase, di/dt is likely to increase. In particular, when a wideband gap semiconductor is used as a material of the transistors Tr, di/dt is likely to increase because the switching speed is faster than the case of using Si. Hence, in order to efficiently reduce the surge voltage, it is important to reduce the interconnection inductance contained in the inductance L by arranging the surge voltage absorption device 50 near the first circuit unit 10A and the second circuit unit 10B that includes the transistor Tr.

In the semiconductor module 1, the second circuit unit 10B on the lower arm side is mounted on the circuit board 20 inversely in a vertical direction relative to the first circuit unit 10A on the upper arm side. Hence, the first circuit unit 10A and the second circuit unit 10B are connected to each other in series by electrically connecting the conductive plate 11 of the second circuit unit 10B to the second conductive pattern 122b of the first circuit unit 10A while mounting the first circuit unit 10A on the P pad 22 and mounting the second circuit unit 10B on the N pad 23.

Thus, in the configuration of the semiconductor module 1, the first circuit unit 10A and the second circuit unit 10B are mounted on the P pad 22 and the N pad 23 connected via the surge voltage absorption device 50. Thus, because the transistors Tr contained in the first circuit unit 10A and the second circuit unit 10B are disposed near the surge voltage absorption devices 50, the interconnection inductance of the current path between the surge voltage absorption device 50 and the transistor Tr can be reduced. As a result, because the surge voltage is efficiently reduced, in the series circuit of the first circuit unit 10A and the second circuit unit 10B, the direct voltage applied to the drain electrode pad DP of the transistor Tr contained in the first circuit unit 10A and the source electrode pad SP of the transistor Tr contained in the second circuit unit 10B can be stabilized.

In the semiconductor module 1, the first circuit unit 10A and the second circuit unit 10B are connected to each other in series via the conductive plate 30 disposed to sandwich the first circuit unit 10A and the second circuit unit 10B between the circuit board 20 and the conductive plate 30. Thus, a degree of freedom of design such as a shape and an arrangement of a pad on the insulating substrate 21 (for example, the P pad 22, the N pad 22 and the 0 pad 24) improves.

For example, as illustrated in FIG. 6 to FIG. 8, the P pad 22 and the N pad 23 can be formed so that at least the first unit mounting region 221 of the P pad 22 and the second unit mounting region 231 of the N pad 23 face, and that facing edge 22a and edge 23a are parallel to each other. In this case, the surge voltage absorption devices 50 can be disposed to connect the edge 22a to the edge 23b. As a result, because the surge voltage absorption devices 50 are disposed between the first circuit units 10A and the second circuit units 10B in a direction perpendicular to an extending direction of the edge 22a (or edge 23b), the current paths between the transistors Tr contained in the first circuit units 10A and the second circuit units 10B, and the surge voltage absorption devices 50 shorten more, and the influence of the inductance can be more decreased. Furthermore, because the P pad 22 and the N pad 23 can be arranged close to each other, the semiconductor module can be downsized.

By improving the degree of freedom of design of, for example, the P pad 22, the N pad 23 and the 0 pad 24 on the insulating substrate 21, for example, the degree of freedom of an arrangement of the 0 pad 24 improves. Hence, the design of the semiconductor module 1 becomes easy.

In the semiconductor module 1, the second circuit unit 10B is mounted on the circuit board 20 inversely in the vertical direction relative to the first circuit unit 10A. Thus, the source electrode pad SP of the transistor Tr contained in the first circuit unit 10A and the drain electrode pad DP of the transistor Tr contained in the second circuit unit 10B can be electrically connected to each other via the single conductive plate 30 disposed opposite to the circuit board 20. Accordingly, the semiconductor module 1 whose surge voltage is reduced by connecting the P pad 22 to the N pad 23 via the surge voltage absorption device 50 can be manufactured at a low cost.

Because the conductive plate 30 has a cut-out part 31, even if the conductive plate 30 is disposed so as to sandwich the first circuit unit 10A and the second circuit unit 10B between the circuit board 20 and the conductive plate 30, because part of the third conductive pattern 122c and the fourth conductive pattern 122d of the first circuit unit 10A is reliably exposed from the conductive plate 30, the third conductive pattern 122c can be readily connected to the pad for the first control signal 25 via the first wire W1, and the fourth conductive pattern 122d can be readily connected to the auxiliary pad 27 via the second wire w2.

Although the embodiments and modifications thereof of the present disclosure have been described hereinabove, the present disclosure is not limited to a variety of embodiments described above, and a variety of variations and modifications can be made without departing the purpose of the present disclosure.

Figure 11:
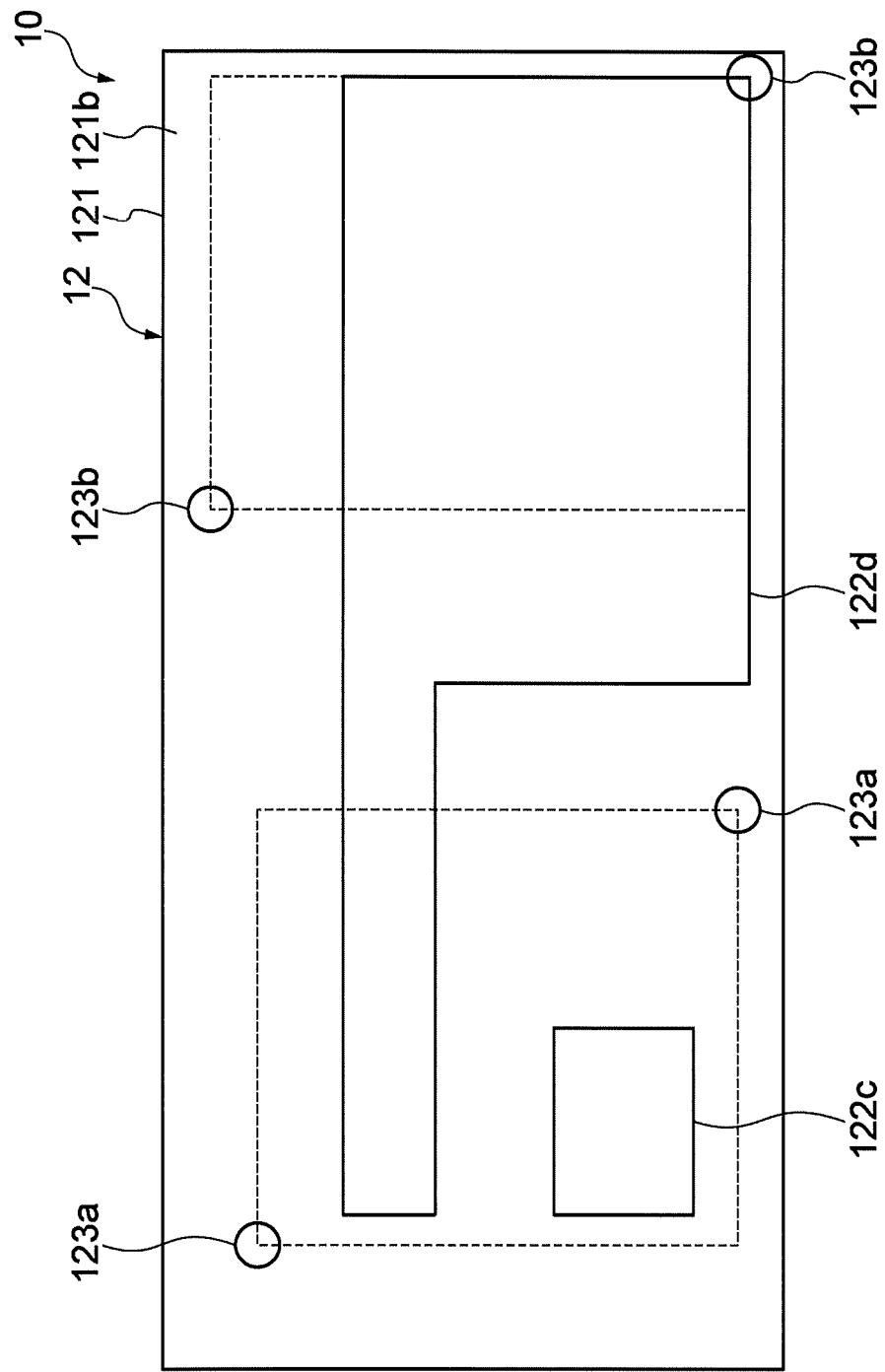
FIG. 11 is a diagram for explaining a modification example of the circuit unit.

For example, in the circuit unit 10, a hole for confirming a position to confirm a fixing position (mounting position) of the transistor Tr may be famed in at least one of the circuit board 12 and the conductive plate 11, which is described with reference to FIG. 11. FIG. 11 illustrates a form of forming a position confirmation hole 123a to confirm a fixing position (mounting position) of the transistor Tr on the circuit board 12 and a position confirmation hole 123a to confirm a fixing position (mounting position) of the diode Di.

The position confirmation hole 123a and a position confirmation hole 123b are through holes that penetrate through the circuit board 12. The shape of the position confirmation hole 123a and the position confirmation hole 123b as seen in a thickness direction is a circle, an example of the diameter of the position confirmation hole 123a and the position confirmation hole 123b is 2 mm or less.

In the form of the circuit board 12 including the position confirmation hole 123a and the position confirmation hole 123b, for example, alignment between the circuit board 12, and the transistor Tr and the diode Di is easy in fixing the circuit board 12 to the transistor Tr and the diode Di, or in simultaneously bonding the conductive plate 11, the transistor Tr, the diode Di, and the circuit board 12 after mounting, for example, the transistor Tr and the diode Di on the conductive plate 11.

The position confirmation hole 123a and the position confirmation hole 123b may not be a cylindrical hole, for example, but may have a shape with a diameter increasing toward a surface 121b side of the insulating substrate 121 (for example, mortar shape). Thus, visibility of the transistor Tr and the diode Di improves through the position confirmation hole 123a and the position confirmation hole 123b. The position confirmation hole 123a and the position confirmation hole 123b may be a linear cut-out.

As illustrated in FIG. 11, forming positions of the position confirmation hole 123a and the position confirmation hole 123b are not limited to corner parts in an arranged position of the transistor Tr and the diode Di. However, if the corner parts of the transistor Tr and the diode Di are formed in a viewable manner, the alignment is easy.

In a form of forming the position confirmation hole in the circuit board 12, as illustrated in FIG. 11, both of the position confirmation hole 123a and the position confirmation hole 123b do not have to be formed in the circuit board 12. The alignment between the gate electrode pad GP and the source electrode pad SP of the transistor Tr, and the first conductive pattern 122a and the second conductive pattern 122b, is more difficult than the alignment between the anode AP of the diode Di and the second conductive pattern 122b, and accuracy of the alignment is required. Hence, in the form of forming the position confirmation hole in the circuit board 12, the position confirmation hole 123a may be formed. The position confirmation hole 123a is preferably formed at two or more locations, for example, for alignment of the transistor Tr, which corresponds to the position confirmation hole 123b.

FIG. 11 illustrates an example of forming the position confirmation holes in the circuit board 12, but the position confirmation holes may be formed in the conductive plate 11. The shape, the arrangement and the like of the position confirmation holes may be the same as the case of the circuit board 12.

The circuit board (first circuit board) 20 may not have an output interconnection pattern. In this case, for example, an end of the output terminal 44 may be directly connected to the conductive plate 30.

The first circuit unit 10A and the second circuit unit 10B may differ from each other in a distance between the transistor Tr and the diode Di, arranged positions relative to the conductive plate 11 (or circuit board 12) of the transistor Tr and the diode Di, the arrangement and shapes of the first conductive pattern 122a, the second conductive pattern 122b, the third conductive pattern 122c and the fourth conductive pattern and the like as long as the conductive plate 11, the transistors Tr, the diodes Di and the circuit board 12 implements the arrangement conditions and the connection relationship as illustrated.

FIG. 6 to FIG. 9 illustrate he form of mounting the three first circuit units 10A on the P pad 22 and the three second circuit units 10B on the N pad 23. However, a number of each of the first circuit units 10A and the second circuit units 10B may be one, or four or more. The numbers of the first circuit unit 10A and the second circuit units 10B may differ from each other.

An example of the second plate member contained in the circuit unit is not limited to the conductive plate, and may be the second plate member including a conductive region on a top surface side and a conductive region on a back surface side. For example, the second plate member may have a configuration including a conductive layer (second top surface side conductive region) formed on a top surface of an insulating substrate, a conductive layer (second back surface side conductive region) on a back surface, and for example, a via, a lateral surface metallization layer and the like to electrically connect the conductive layers on the top surface and the back surface to each other. Similarly, an example of the first plate member contained in the semiconductor module is not limited to a conductive plate. A plate member having a back surface side conductive region may be used to be able to electrically connect a plurality of circuit units disposed on the first circuit substrate. For example, the first plate member may have a configuration having a conductive layer (back surface side conductive region) formed on a back surface (surface on the first circuit unit side) of an insulating substrate. The first plate member may be a member that has the top surface side conductive region electrically connected to the back surface side conductive region. For example, the first plate member may have a configuration of including a conductive layer (back surface side conductive region) formed on a back surface (surface on the first circuit unit side) of an insulating substrate and a conductive layer (top surface side conductive region) formed on a top surface of the insulating substrate, and electrically connecting the conductive layers on the top surface and the back surface to each other. As described above, in the form of the first plate member including the back surface side region, the top surface side region, and the output interconnection pattern, for example, by electrically connecting the top surface side conductive region to the output interconnection pattern, the back surface side conductive region and the output interconnection pattern can be electrically connected to each other. As described above, in the form of the first plate member including the back surface side conductive region and the top surface side conductive region, without the output interconnection pattern, for example, by directly connecting an end of the output terminal to the top surface side conductive region, the back surface side conductive region and the output terminal can be electrically connected to each other.

In the above embodiments, a capacitor has been illustrated as the surge voltage absorption device. However, any device capable of absorbing the surge voltage is available for the surge voltage absorption device. For example, an RC circuit (or RC snubber device) including a capacitor and a resistor combined with each other. The surge voltage absorption device is not limited to the arrangement states illustrated in FIG. 6 to FIG. 8 as long as the surge voltage absorption device 50 is disposed to connect the P pad 22 to the N pad 23. Moreover, the semiconductor module containing the circuit unit may not include the surge voltage absorption device.

Furthermore, for example, the conductive plate 30 may be configured to have an opening formed at a position that covers the surge voltage absorption device 50.

Figure 12:
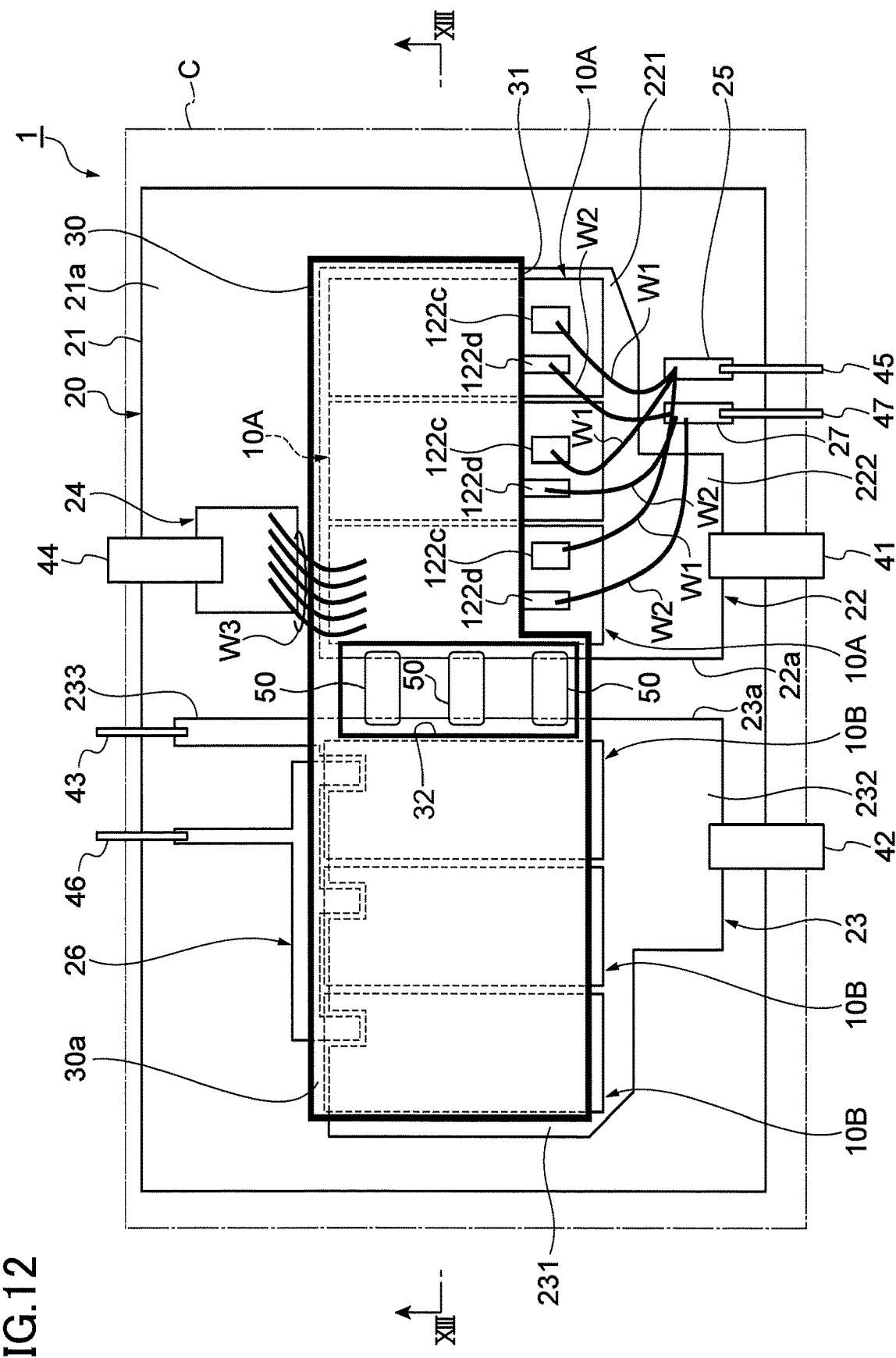
FIG. 12 is a diagram for explaining a modification example of the conductive plate (first plate member)

FIG. 12 illustrates a semiconductor module 1 in a form of a conductive plate 30 having an opening at a position that covers the surge voltage absorption device 50. Thus, the opening 32 may be formed in a region that contains a portion overlapping the surge voltage absorption devices 50 in a plan view provided between the edge 22a of the first circuit unit 10A and the edge 23a of the second circuit unit that are disposed at the most inner position. By providing such an opening 32 in the region that overlaps with the surge voltage absorption device 50 of the conductive plate 30 in a plan view, the surge voltage absorption devices 50 can be exposed, and heat of the surge voltage absorption devices 50 are likely to be released. Moreover, a radiation space can be formed in a region between the first circuit unit 10A and the second circuit unit 10B, and can contribute the radiation from the first circuit unit 10A and the second circuit unit 10B.

FIG. 12 illustrates an example of providing the single opening 32 that covers all of the plurality of surge voltage devices 50, but a plurality of openings 32 may be independently provided for the respective surge voltage absorption devices 50. Moreover, a single opening 32 may be provided for a predetermined plurality of surge voltage absorption devices 50, for example, so that a single opening 32 is provided for two surge voltage absorption devices 50. However, when considering the easiness of processing, efficacy of radiation and the like, as illustrated in FIG. 12, the single opening 32 having an area that can contain all of the surge voltage absorption devices 50 is preferably formed.

Here, because the component other than the opening 32 are the same as those of the semiconductor module 1 illustrated in FIG. 6, same reference sings are attached to corresponding components, and the description is omitted.

Figure 13:
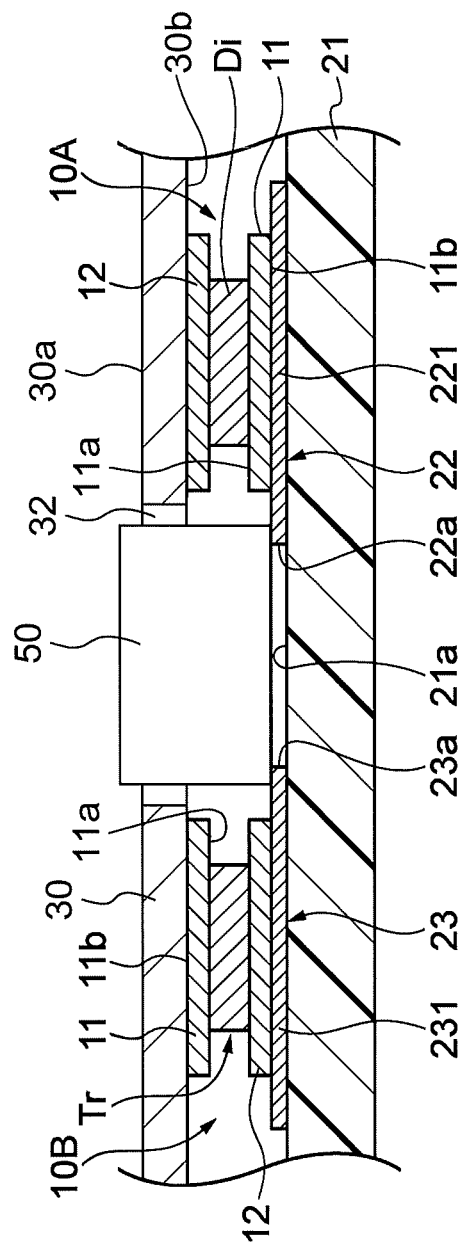
FIG. 13 is a partial enlarged diagram of a cross section taken along line XIII-XIII in FIG. 12.

FIG. 13 is a partial enlarged diagram of a cross-sectional configuration taken along a XIII-XIII line in FIG. 12. As illustrated in FIG. 13, an opening 32 penetrating through a top surface 30a and a back surface 30b of the conductive plate 30 is formed in the conductive plate 30, and the surge voltage absorption device 50 protrudes from the opening 32. In other words, the top surface of the surge voltage absorption device 50 is located at a position that is higher than the top surface of the conductive plate 30. Thus, by forming the opening 32 at a position corresponding to the surge voltage absorption device 50 of the conductive plate 30, a limitation of height of the surge voltage absorption device 50 can be removed, and a larger surge voltage device 50 can be mounted, thereby expanding a width of a part choice for the semiconductor module 1, and properly forming the semiconductor module 1 depending on the intended use.

Moreover, because the top surface of the surge voltage absorption device 50 protrudes from the conductive plate 30, the opening 32 may be provided in the region that covers the surge voltage absorption devices 50 in the conductive plate 30, and the surge voltage absorption devices 50 may be configured to protrude higher than the top surface of the conductive plate 30. A degree of freedom of design of the semiconductor module 1 can be increased, and the radiation efficiency can be further improved.

The semiconductor module is not limited to a configuration of a single-phase power converter circuit such as a single-phase invertor circuit, and may have a configuration of a two-phase or three-phase power converter circuit.

The diode has been illustrated as a circuit element contained in the circuit units, but the circuit element is not limited to the diode. For example, a circuit element disposed between the second plate member and the second circuit substrate and electrically connected to a vertical type transistor via the second plate member and the second circuit substrate is applicable. For example, a transistor may be the circuit element. In this case, the first electrode pad of the circuit element corresponds to the first main electrode pad of the transistor; the second electrode pad corresponds to the second main electrode pad; and the circuit unit corresponds to a parallel circuit of at least two transistors.

DESCRIPTION OF THE REFERENCE NUMERALS 1 semiconductor module
10 circuit unit
10A first circuit unit
10B second circuit unit
11 conductive plate (second plate member)
11a top surface
11b back surface
12 circuit board (second circuit board)
20 circuit board (second circuit board)
21 insulating substrate (first insulating substrate)
22 P pad (first input interconnection pattern)
23 N pad (second input interconnection pattern)
24 O pad (output interconnection pattern)
25 pad for a first control signal
30 conductive plate (first plate member)
31 cut-out
32 opening
50 surge voltage absorption device
121 insulating substrate (second insulating substrate)
121a back surface
121b top surface
122a first conductive pattern
122b second conductive pattern
122c third conductive pattern
122d fourth conductive pattern
123a position confirmation hole
AP anode (second electrode pad)
CP cathode (first electrode pad)
Di diode (circuit element)
DP drain electrode pad (first main electrode pad)
GP gate electrode pad
SP source electrode pad (second main electrode pad)
Tr transistor

The invention claimed is:

1. A semiconductor module, comprising:
a first circuit board including a first insulating substrate, a first input interconnection pattern formed on a surface of the first insulating substrate, a second input interconnection pattern, a first control interconnection pattern and a second control interconnection pattern;
N (N being an integer of two or more) circuit units mounted on the first circuit board;
a first plate member disposed opposite to the first circuit board with respect to the N circuit units and including a back surface side conductive region; and
a surge voltage absorption device connecting the first input interconnection pattern to the second input interconnection pattern and configured to absorb a surge voltage,
wherein the first circuit units includes:
a second plate member including a top surface side conductive region and a back surface side conductive region electrically connected to each other;
a vertical type transistor including a first main electrode pad, and a second main electrode pad and a gate electrode pad that are formed opposite to the first main electrode pad, wherein the first main electrode pad is opposite to and is electrically connected to the top surface side conductive region of the second plate member;
a second circuit board including a second insulating substrate, a first conductive pattern formed on a back surface of the second insulating substrate and electrically connected to the gate electrode pad, a second conductive pattern formed on the back surface of the second insulating substrate and electrically connected to the second main electrode pad, a third conductive pattern formed on a top surface of the second insulating substrate and electrically connected to the first conductive pattern, and a fourth conductive pattern formed on the top surface of the second insulating substrate and electrically connected to the second conductive pattern, wherein n (n being an integer of one or more and (N−1) or less) first circuit unit of the N circuit units is mounted on the first circuit board so that the back surface side conductive region of the second plate member is opposite to and is electrically connected to the first input interconnection pattern, wherein (N−n) second circuit unit of the N circuit units is mounted on the first circuit board so that the third conductive pattern of the second circuit board is opposite to and is electrically connected to the second control interconnection pattern and that the fourth conductive pattern of the second control interconnection pattern is opposite to and is electrically connected to the second input interconnection pattern, wherein the first main electrode pad is disposed closer to the first circuit board than the second main electrode pad and the gate electrode pad of the vertical transistor in the n first circuit unit whereas the second main electrode pad and the gate electrode pad are disposed closer to the first circuit board than the first main electrode pad of the vertical transistor in the (N−n) second circuit unit, wherein the first plate member electrically connects the fourth conductive pattern of the second circuit board contained in the n first circuit unit to the second plate member contained in the (N−n) second circuit unit, and wherein the gate electrode pad of the vertical type transistor contained in the n first circuit unit is electrically connected to the first control interconnection pattern.

2. The semiconductor module as claimed in claim 1, wherein a position confirmation hole of the vertical type transistor is formed in at least one of the second circuit board and the second plate member contained in the circuit units.

3. The semiconductor module as claimed in claim 1, wherein the circuit units further comprises a circuit element disposed between the second plate member and the second circuit board and is electrically connected to the vertical type transistor via the second plate member and the second circuit board.

4. The semiconductor module as claimed in claim 3, wherein the circuit element further comprises:
a first electrode pad that is opposite to and is electrically connected to the back surface of the second insulating substrate; and
a second electrode pad that is formed opposite to the first electrode pad and is electrically connected to the top surface side conductive region of the second plate member.

5. The semiconductor module as claimed in claim 4, wherein the circuit element is a diode,
wherein the first electrode pad is an anode pad, and
wherein the second electrode pad is a cathode pad.

6. The semiconductor module as claimed in claim 1, wherein an opening is provided in a region that overlaps with the surge voltage absorption device of the first plate member in a plan view.

7. The semiconductor module as claimed in claim 6, wherein a surface opposite to the first insulating substrate of the surge voltage absorption device protrudes from the opening of the first plate member.

8. The semiconductor module as claimed in claim 1, wherein the first plate member is a conductive plate.

9. The semiconductor module as claimed in claim 1, wherein the second plate member is a conductive plate.

* * * * *